(12) United States Patent
Kim

(10) Patent No.: US 11,296,222 B2
(45) Date of Patent: Apr. 5, 2022

(54) LATERAL DOUBLE DIFFUSED METAL OXIDE SEMICONDUCTOR AND METHOD OF FABRICATING SAME

(71) Applicant: DB HiTek Co., Ltd., Seoul (KR)

(72) Inventor: Joo-Hyung Kim, Seoul (KR)

(73) Assignee: DB HiTek Co., Ltd., Seoul (KR)

(*) Notice: Subject to any disclaimer, the term of this patent is extended or adjusted under 35 U.S.C. 154(b) by 0 days.

(21) Appl. No.: 16/924,737

(22) Filed: Jul. 9, 2020

(65) Prior Publication Data

US 2021/0028307 A1 Jan. 28, 2021

(51) Int. Cl.
| | | |
|---|---|---|
| *H01L 29/78* | (2006.01) | |
| *H01L 29/66* | (2006.01) | |
| *H01L 21/76* | (2006.01) | |
| *H01L 29/06* | (2006.01) | |
| *H01L 29/10* | (2006.01) | |
| *H01L 29/40* | (2006.01) | |
| *H01L 21/762* | (2006.01) | |
| *H01L 21/765* | (2006.01) | |

(52) U.S. Cl.
CPC ........ *H01L 29/7816* (2013.01); *H01L 21/765* (2013.01); *H01L 21/76202* (2013.01); *H01L 29/0653* (2013.01); *H01L 29/1095* (2013.01); *H01L 29/402* (2013.01); *H01L 29/408* (2013.01); *H01L 29/66681* (2013.01)

(58) Field of Classification Search
CPC ..... H01L 29/06; H01L 29/0653; H01L 29/10; H01L 29/1095; H01L 29/40; H01L 29/402; H01L 29/408; H01L 29/66; H01L 29/66681; H01L 29/78; H01L 29/7816; H01L 21/76; H01L 21/762; H01L 21/765; H01L 21/76202
USPC ........................................................ 257/339
See application file for complete search history.

(56) References Cited

U.S. PATENT DOCUMENTS

2013/0075816 A1 3/2013 Yoo et al.
2017/0250259 A1* 8/2017 Mori ................. H01L 21/26513

FOREIGN PATENT DOCUMENTS

KR 10-2013-0032621 A 4/2013

* cited by examiner

*Primary Examiner* — Fazli Erdem
(74) *Attorney, Agent, or Firm* — Andrew D. Fortney; Central California IP Group, P.C.

(57) ABSTRACT

A lateral double diffused metal oxide semiconductor (LDMOS) transistor and a semiconductor can reduce the size of the entire power block and can decrease costs by preventing formation of an edge termination region between adjacent device tips or ends along a width direction when the corresponding LDMOS transistor cell has a limited width and the LDMOS transistor is a multi-finger LDMOS transistor.

11 Claims, 11 Drawing Sheets

LATERAL DOUBLE DIFFUSED METAL OXIDE SEMICONDUCTOR AND METHOD OF FABRICATING SAME

CROSS REFERENCE TO RELATED APPLICATION

The present application claims priority to Korean Patent Application No. 10-2019-0088861, filed Jul. 23, 2019, the entire contents of which are incorporated herein for all purposes by this reference.

BACKGROUND OF THE INVENTION

Field of the Invention

The present invention relates to a lateral double diffused metal oxide semiconductor (LDMOS) transistor and, more particularly, to a semiconductor that can reduce the size of an entire power block and can decrease costs by omitting an edge termination region between adjacent device tips or ends along a width direction of a multi-finger LDMOS transistor cell having a limited width.

Description of the Related Art

An LDMOS transistor is a high-voltage power device that has the advantages of a high switching speed, a high input impedance, a low power consumption, compatibility with CMOS processing, etc., and is used as a power device for a motor controller and a vehicle.

FIG. 1 is a plan view of a conventional multi-finger LDMOS transistor, and FIG. 2 is a plan view of a conventional LDMOS transistor.

Hereafter, problems of the conventional multi-finger LDMOS transistor are described in detail with reference to the accompanying drawings.

Referring to FIGS. 1 and 2, in a limited active region defined by an isolation layer forming process, a channel width in a multi-finger LDMOS transistor (for example, a 2-finger LDMOS transistor) is two times that of the single-finger LDMOS transistor channel width in a core region C, which includes a source region S and a drain region D. Accordingly, the channel width of a limited-width, multi-finger LDMOS transistor is increased considerably in comparison to the corresponding single-finger LDMOS transistor, so it is possible to easily reach a desired level. This improves the electrical characteristic(s) of a device.

However, the multi-finger LDMOS transistor includes surrounding edge termination regions E at opposite ends of the device (e.g., outside of the core region C), so the size of a power block including the multi-finger LDMOS transistor is unavoidably and excessively increased. For example, devices adjacent to each other along the width direction unavoidably include both edge termination regions E and isolation regions I, which may overlap each other. That is, an LDMOS transistor cell with a limited maximum width should be a multi-finger LDMOS transistor, but in the process of making the multi-finger LDMOS transistor, edge termination regions E without a channel region are repeatedly formed. This increases the size of the power block and the cost of the device(s).

SUMMARY OF THE INVENTION

In order to solve the problems of the related art, the present invention includes a LDMOS transistor and a method for fabricating the LDMOS transistor.

The present invention has been made in an effort to solve the problem(s) in the related art, and an objective of the present invention is to provide an LDMOS transistor that reduces the size of a power block and decreases the cost by omitting the edge termination regions between core regions of adjacent multi-finger LDMOS transistors along a width direction (e.g., of the LDMOS transistors or channels thereof), and a method of fabricating the LDMOS transistor(s). The LDMOS transistors may be repeated and/or in an array.

Another objective of the present invention is to provide an LDMOS transistor that enables good isolation between devices, even though the surrounding area between adjacent tips or ends of the adjacent LDMOS transistors is removed, by an isolation layer (which may be in an isolation region) close or adjacent to a gate field plate in a drift region of the LDMOS transistor(s), and a method of fabricating such LDMOS transistor(s).

Another objective of the present invention is to provide an LDMOS transistor that enables high-integration of an active region by including one or more shallow trench isolation (STI) structures (e.g., in an isolation region and/or a drift region of the LDMOS transistor), and a method of fabricating such an LDMOS transistor.

In order to achieve the objects, the present invention may be accomplished by one or more of the following embodiments and/or configurations.

According to one or more embodiments of the present invention, a multi-finger lateral double diffused metal oxide semiconductor (LDMOS) transistor includes a core region providing a current path through a channel between a source and a drain (e.g., of the LDMOS transistor) when a voltage is applied (e.g., to a gate of the LDMOS transistor), and a device isolation region including one or more shallow trench isolation (STI) structures in the core region.

According to one or more other embodiments of the present invention, the LDMOS transistor may omit or not include an edge termination region between it and an adjacent LDMOS transistor along a width direction (e.g., of the channel and/or the LDMOS transistor).

According to one or more other embodiments of the present invention, the LDMOS transistor may further include a substrate, a second conductivity type buried layer on or in the substrate, a first conductivity type semiconductor layer on the buried layer, a first conductivity type body region on or in the semiconductor layer, and a second conductivity type drift region on or in the semiconductor layer, in which the STI structure(s) may be in the drift region.

According to one or more other embodiments of the present invention, the LDMOS transistor may further include a gate electrode on or over the semiconductor layer, a gate field plate under at least part of the gate electrode, and a second conductivity type drain region in the drift region. The gate field plate may at least partially overlap the gate electrode and may be between the gate electrode and the drain region.

According to one or more other embodiments of the present invention, the gate field plate may be formed using a process different from the STI structure (e.g., the gate field plate may comprise a field oxide).

According to one or more other embodiments of the present invention, the STI structure may extend from a surface of the drift region and have a lowermost surface deeper than a lowermost surface of the gate field plate.

According to one or more other embodiments of the present invention, the STI structure may be in a space between the gate field plate and the drain region.

According to one or more other embodiments of the present invention, a multi-finger lateral double diffused metal oxide semiconductor (LDMOS) transistor includes a substrate, a second conductivity type buried layer on or in the substrate, a first conductivity type semiconductor layer on the buried layer, a first conductivity type body region on or in the semiconductor layer, a second conductivity type drift region on or in the semiconductor layer, gate electrode on or over the semiconductor layer, a LOCOS region or field oxide at least partially under the gate electrode, a second conductivity type drain region in the drift region, and STI regions adjacent to the LOCOS region or field oxide in the drift region, in which the STI regions are spaced apart from each other (e.g., in a longitudinal direction) a width direction of the LDMOS transistor.

According to one or more other embodiments of the present invention, the LDMOS transistor may further include a second conductivity type source region in the body region, in which the STI regions may be between the source region and the drain region.

According to one or more other embodiments of the present invention, the LDMOS transistor further comprises a core region having opposed ends, and may omit or not include the edge termination region at one end of the core region (e.g., between adjacent devices along the width direction of the LDMOS transistor).

According to one or more other embodiments of the present invention, the STI regions may be between the LOCOS region or field oxide and the drain region, and lowermost surfaces of the STI regions may be deeper than a lowermost surface of the LOCOS region or field oxide.

According to one or more other embodiments of the present invention, the LDMOS transistor may further include a first conductivity type contact region adjacent to the source region in the body region.

According to one or more other embodiments of the present invention, a multi-finger lateral double diffused metal oxide semiconductor (LDMOS) transistor has a core region including a source and a drain, a channel between the source and the drain, and a device isolation region; a body region on or in a first conductivity type semiconductor layer; a drift region on or in the semiconductor layer; a gate electrode on or over the semiconductor layer; a gate field plate at least partially under the gate electrode; a drain region in the drift region; and a plurality of STI structures spaced apart from each other (e.g., in a longitudinal direction) at predetermined positions in the core region, the drift region, or the isolation region.

According to one or more other embodiments of the present invention, the core region may be connected to another core region (e.g., in an adjacent LDMOS transistor), between adjacent device tips or ends (e.g., of the LDMOS transistor and the adjacent LDMOS transistor) along the width direction of the LDMOS transistor.

According to one or more other embodiments of the present invention, the isolation region may be in the core region, and the STI structures may be in a space between the gate field plate and the drain region, in the drift region and at an interface of a device tip or end and the isolation region.

According to embodiments of the present invention, a method of fabricating a multi-finger lateral double diffused metal oxide semiconductor (LDMOS) transistor includes forming a first trench and a second trench on or in a first conductivity type semiconductor layer, forming an STI structure in the first trench using an STI process, forming a gate field plate in the second trench using a LOCOS process, forming a body region in the semiconductor layer, forming a drift region in the semiconductor layer, forming a source region in the body region, and forming a drain region in the drift region, wherein an edge termination region is omitted from an end of the LDMOS transistor.

According to one or more further embodiments of the present invention, the method may form a plurality of STI structures spaced apart from each other in the drift region at predetermined positions along a width direction of the LDMOS transistor.

According to another embodiment of the present invention, the STI structure may be formed before the gate field plate.

According to another embodiment of the present invention, the STI structure may be between a gate field plate and a drain region.

The present invention having the above configuration has the following effects.

The present invention has the effect that edge termination regions between core regions of adjacent multi-finger LDMOS transistors (e.g., in or along a width direction of the LDMOS transistors) are omitted in an array of the multi-finger LDMOS transistors, thereby reducing the size of a power block (e.g., including the LDMOS transistor array) and thus decreasing the cost.

The present invention has the effect that good isolation is possible between LDMOS devices even though the edge termination area between adjacent device tips or ends is omitted, by forming an STI structure in an isolation region, close to a gate field plate in a drift region.

The present invention has the effect that the STI structure is able to achieve high integration of active regions.

Even if not clearly stated herein, the expected and/or latent effects of the technological characteristics of the present invention and described in the following description should be construed as being described in the present specification.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, embodiments of the present invention will be described in detail with reference to the accompanying drawings. Embodiments of the present invention may be changed in various ways and the range of the present invention should be construed on the basis of claims rather than being limited to the following embodiments. The embodiments are provided as reference to more completely explain the present invention to those skilled in the art.

In the following description, when a component is "on", "over", or "above" another component, it includes both of the cases in which the component is in contact with the upper surface of another component and at a predetermined distance from another component. When a component is spaced apart from another component, another embodiment may be further between the components. When a component is "directly on another component" another component, another component cannot be between the components.

As long as an embodiment can be implemented in another way, it should be noted that an LDMOS transistor according to the present invention can be fabricated in a different order from the described order. For example, two continuous functions or operations may be performed substantially simultaneously or in the reverse order.

Although a "first conductivity type" is exemplified by a P-type and a "second conductivity type" is exemplified by an N-type in the following description, the present invention is not limited thereto.

Figure 1:
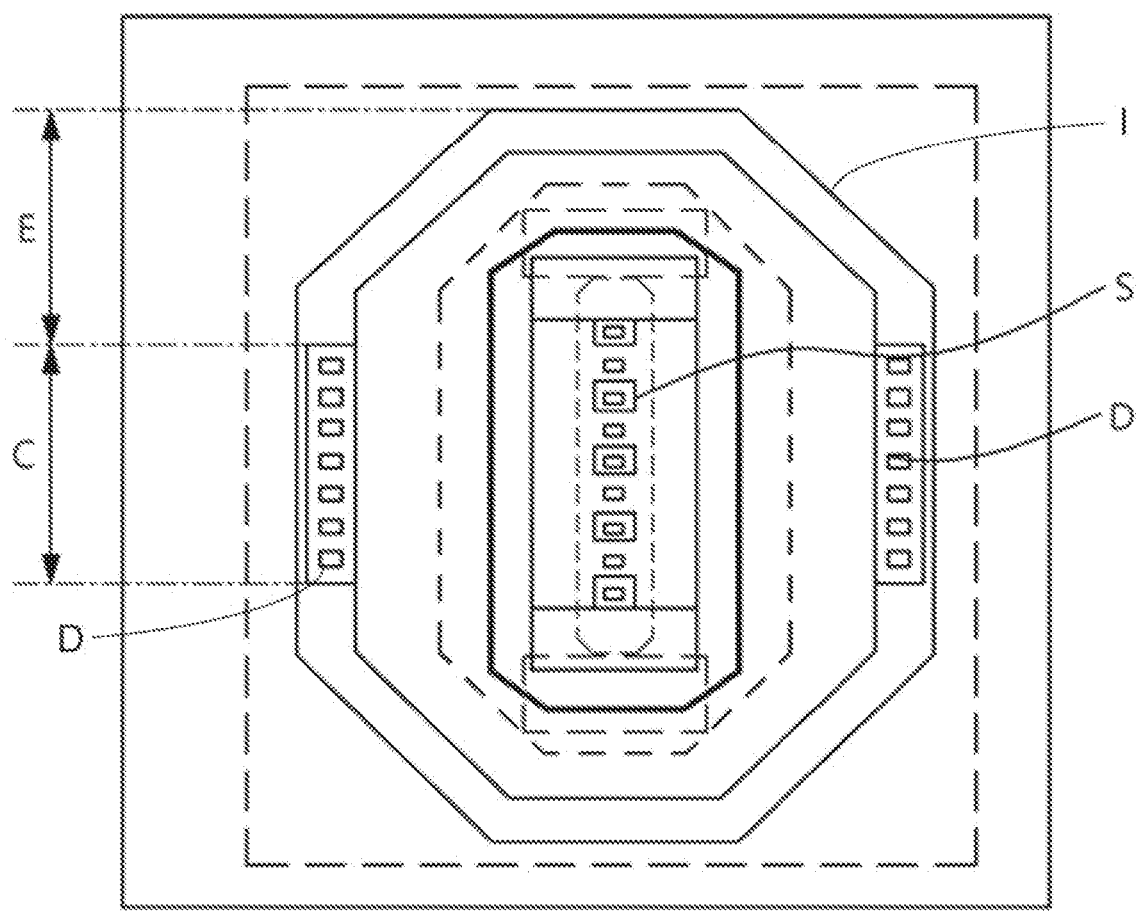
FIG. 1 is a plan view of a conventional multi-finger LDMOS transistor.
Figure 2:
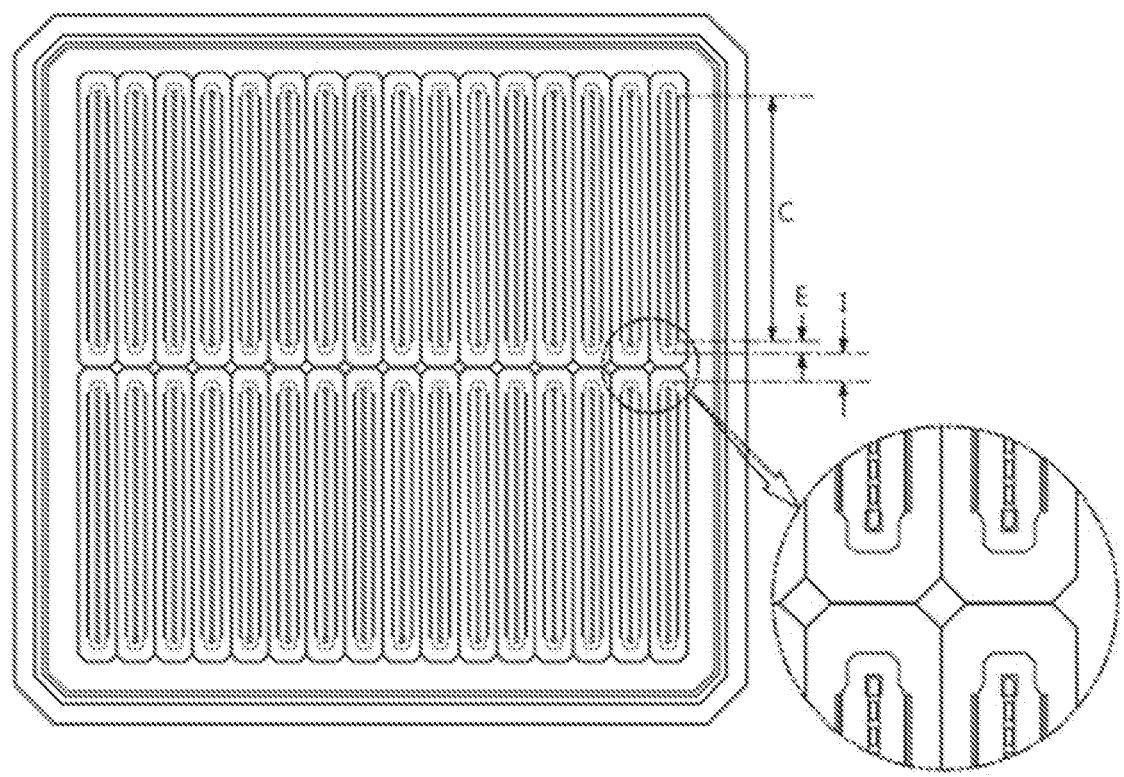
FIG. 2 is a plan view of one or more conventional LDMOS transistors.

FIG. 1 is a plan view of a conventional multi-finger LDMOS transistor, and FIG. 2 is a plan view of a conventional LDMOS transistor.

Before a lateral double diffused metal oxide semiconductor (LDMOS) transistor 1 (FIG. 3) according to one or more embodiments of the present invention is described in detail, an array structure of a multi-finger LDMOS transistor described with reference to the accompanying drawings.

Referring to FIG. 1, a conventional multi-finger LDMOS transistor has a core region C providing a current path in a width direction through a channel that is between a source S and a drain D when a voltage is applied to the gate (which is either not shown or not identified in FIG. 1), surrounding edge termination regions E that do not include a channel, and an isolation region I (e.g., a device isolation region).

In general, the electric field concentration at the tips or ends of the source (also identified as "a source finger") and the drain (also identified as "drain fingers") limits the breakdown voltage of the LDMOS transistor, so the surrounding edge termination regions E at the tips or ends of the source and drain fingers are polygonal or rounded (i.e., not rectangular or "squared off"), but the geometry of the edge termination regions E is not specifically limited thereto.

The edge termination regions E are usually at opposite ends of the core region C. Accordingly, for example, on a chip or wafer containing an array of multi-finger LDMOS transistors, edge termination regions E of adjacent devices are equidistant from a vertical axis in the plan view of FIG. 1 (e.g., along an x-axis or in the width direction in FIG. 1). The "width direction" of an LDMOS transistor is a direction orthogonal to the channel length in a top-down or plan view of the LDMOS transistor. Accordingly, when an LDMOS transistor cell with a limited area comprises multi-finger LDMOS transistors, the edge termination regions E may overlap (e.g., along the x-axis).

At least part of the isolation region I may be between the adjacent edge termination regions E. The isolation region I may be formed by local oxidation of silicon (LOCOS) or a shallow trench isolation (STI) process, the latter of which may maximize the area of the active region (e.g., for high integration of the active region) relative to LOCOS. In the LOCOS process, the "bird's beak" phenomenon reduces the ability to integrate structures in the active region and may reduce the available area for the active region (e.g., for a fixed or given area of the LDMOS transistor), so the isolation layer in the isolation region I preferably formed by the STI process.

Figure 3:
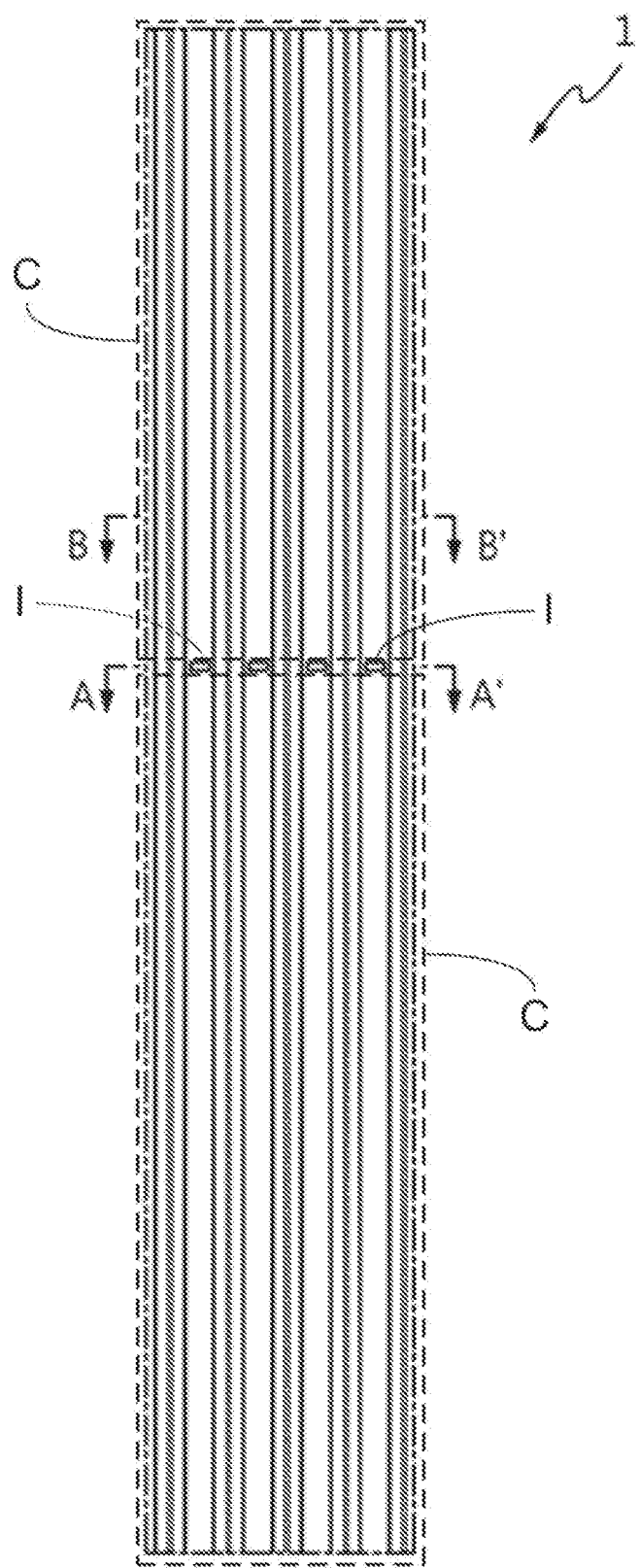
FIG. 3 is a plan view of one or more exemplary multi-finger LDMOS transistors according to one or more embodiments of the present invention.
Figure 4:
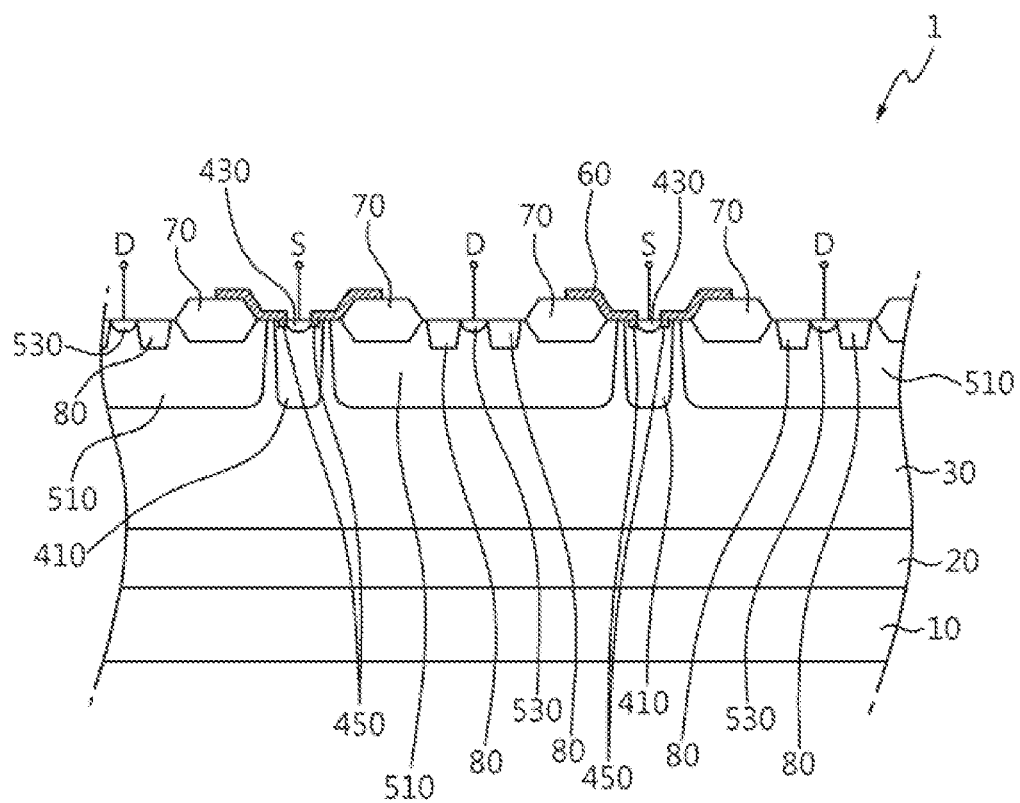
FIG. 4 is a cross-sectional view of the exemplary LDMOS transistor(s) shown in FIG. 3 along the line A-A'.
Figure 5:
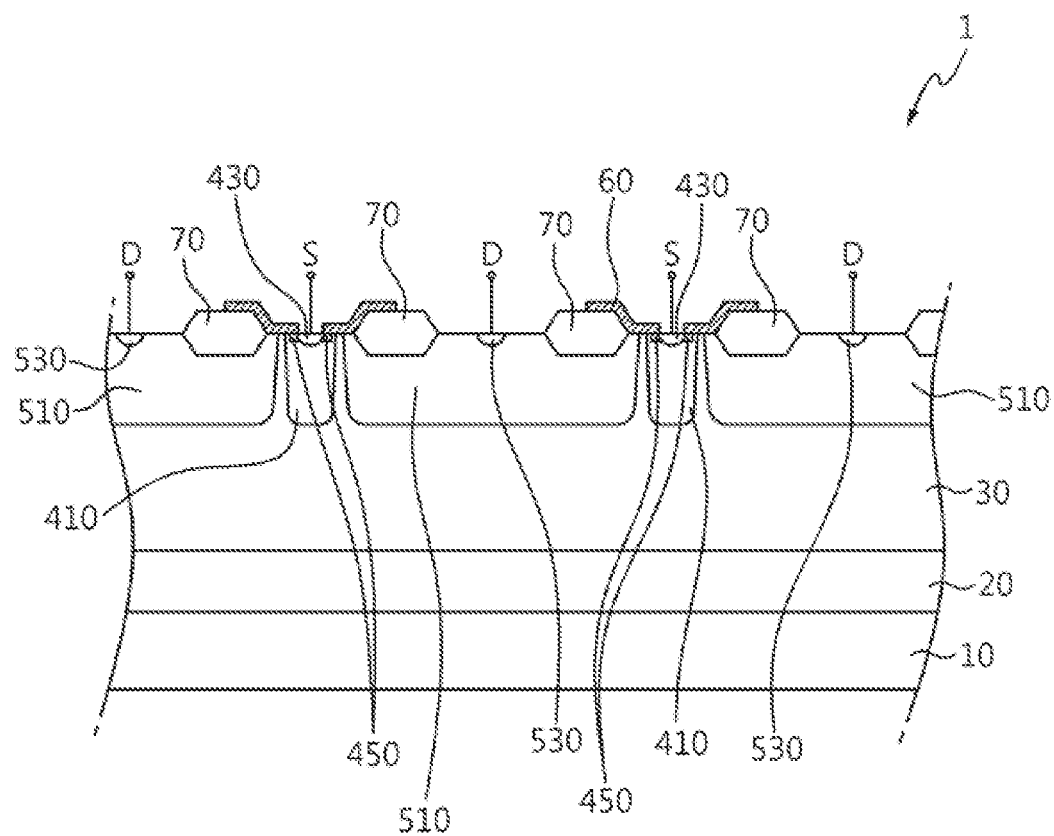
FIG. 5 is a cross-sectional view of the exemplary LDMOS transistor(s) shown in FIG. 3 along the line B-B'.

FIG. 3 is a plan view of an exemplary multi-finger LDMOS transistor 1 according to one or more embodiments of the present invention, FIG. 4 is a cross-sectional view of the exemplary LDMOS transistor 1 along the line A-A' shown in FIG. 3, and FIG. 5 is a cross-sectional view of the exemplary LDMOS transistor 1 along the line B-B' shown in FIG. 3.

An LDMOS transistor according to embodiment(s) of the present invention is described in detail with reference to the accompanying drawings.

Referring to FIGS. 3 to 5, the present invention relates to an LDMOS transistor 1 (e.g., a semiconductor device 1) that can reduce the size of a power block (e.g., including the LDMOS transistor 1) and can decrease costs by excluding the edge termination region E between adjacent device tips or ends in a width direction (e.g., of the LDMOS transistor 1) when a multi-finger LDMOS transistor cell (e.g., for or including the LDMOS transistor 1) has a limited width. That is, the present invention omits edge termination regions E overlapping or adjacent to each other at ends (e.g., of the LDMOS transistor 1). The invention may provide a desired level of channel width in a limited region (e.g., of the LDMOS transistor 1). Details will be described below.

Referring to FIG. 4, an LDMOS transistor 1 according to one or more embodiments of the present invention includes a substrate 10, a second conductivity type buried layer (e.g., an N-buried layer or NBL) 20, and a first conductivity type semiconductor layer 30 on or in the substrate 10. The substrate 10 is or comprises a first conductivity type wafer, and the buried layer 20 increases a punch-through voltage (e.g., of the LDMOS transistor 1) by reducing the area or depth of the depletion region (e.g., between the source S and the drain D of the LDMOS transistor 1) expanding from a body region 410 (to be described below) when a voltage is applied to the drain D. The buried layer 20, for example, may be formed by an ion injection process (e.g., into the substrate 10). The semiconductor layer 30 may be or comprise part of the first conductivity type (e.g., P-type) substrate, a P-type diffusion region in the substrate, or a P-type epitaxial layer (e.g., that has been grown epitaxially) on the substrate.

The first conductivity type body region 410 is on or in the semiconductor layer 30, and in one embodiment, on the surface of the semiconductor layer 30. The doping concentration of the body region 410 may be higher than the doping concentration of the first conductivity type semiconductor layer 30, so that a channel can be easily formed (e.g., as a result of preventing or reducing any increase in the depletion region over a predetermined level).

In the multi-finger LDMOS transistor 1, several body regions 410 may be spaced apart from each other in a longitudinal direction (e.g., along the x-axis of the cross-sectional view shown in FIG. 4). For example, a pair of body regions 410 may be spaced apart from each other with a drift region 510 (described below) therebetween.

A second conductivity type source region 430 may be in the body region 410. For example, it may be at or adjacent to the surface of the semiconductor layer 30. One or more first conductivity type body contact regions 450 may be adjacent to the source region 430 in the body region 410 and are configured to make or provide ohmic contact with the body region 410. For example, the body contact regions 450 may overlap an edge or side of the source region 430. The body contact regions 450 may be or comprise first conductivity type regions doped with a high concentration of impurities (e.g., higher than the dopant concentration of the body region 410).

A second conductivity type drift region 510 is on or in the semiconductor layer 30, and in one or more embodiments, at least partially on the surface of the semiconductor layer 30 and spaced a predetermined distance apart from the body region 410. The drift region 510 may be doped at a concentration lower than the drain regions 530, as described below. Several drift regions 510 may also be spaced apart from each other in the longitudinal direction in the multi-finger LDMOS transistor 1, but the present invention is not limited thereto.

The drain regions 530 are second conductivity type high-concentration impurity regions in the drift region 510. For example, the drain regions 530 may be at or adjacent to the surface of the semiconductor layer 30 and/or the drift region 510. The drain region 530 may be surrounded by the drift region 510.

A gate electrode 60 is on the substrate 10 with a gate insulation layer (not shown) therebetween. An insulation layer (also not shown) is on the gate electrode 60 and between adjacent gate electrodes 60. A gate field plate (or field oxide) 70 is under at least part of the gate electrode 60 (e.g., overlapping part of the gate electrode 60), thereby reducing or preventing a concentration of the electric field at an edge of the gate electrode 60 (e.g., the edge on the gate field plate 70). The gate field plate 70 is formed by a LOCOS process. For example, the gate field plate 70 may be between a bottom surface of the gate electrode 60 and the drain region 530 and may be on and/or in the drift region 510. The STI structures 80 in the drift region 510, between two gate field plates 70 in the same drift region 510 and on opposite sides of the drain region 530, may be formed using a process different from that used to form the gate field plate 70.

The structure and problems of a multi-finger LDMOS transistor of the related art is described in detail hereafter.

Referring back to FIGS. 1 and 2, in a limited-area active region defined by an isolation layer-forming process, the channel width in the multi-finger LDMOS transistors (for example, the 2-finger LDMOS transistor of FIG. 1) in an array of the same is two times the channel width of an otherwise identical single finger LDMOS transistor in the core region C, containing one or more source regions S and one or more drain regions D along the width direction. Accordingly, the channel width is considerably larger in a multi-finger LDMOS transistor cell, in comparison to a single finger type LDMOS transistor containing structures having the same size (e.g., so it is possible to easily reach a desired level and possibly improve the electrical characteristic[s] of a device containing the multi-finger LDMOS transistor).

However, in multi-finger LDMOS transistors, since the edge termination regions E are at opposite ends of the core region C in each transistor of an array of such transistors (e.g., a power block), the size of the power block is unavoidably excessively large. For example, devices adjacent to each other in the width direction in the array include edge termination regions E and isolation regions adjacent to each other and equidstant from a vertical axis (or vertical edge of the chip) in FIG. 2. That is, multi-finger LDMOS transistor cells with a limited maximum width may include multiple edge termination regions E without a channel region in the array. This increases the size and cost of the power block.

In order to solve these problems, referring to FIG. 3, an edge termination region E between adjacent devices in the width direction is omitted in the LDMOS transistor 1 according to embodiments of the present invention. That is, it may be possible to more easily obtain a desired width of the channel region, and accordingly, to reduce the size of the power block when the present invention is used. Since the edge termination region E is not present in the region between adjacent LDMOS transistors along the width direction of the LDMOS transistors, the isolation region I may be separately formed, which will be described below.

In the LDMOS transistor 1, according to one or more embodiments of the present invention, one or more STI structures 80 limiting an active region within an LDMOS transistor and/or electrically separating adjacent LDMOS transistor devices is in the isolation region I (the isolation region I is either not shown or not identified in FIG. 3). The STI structures 80 (FIG. 4) may be formed using an STI process, which is different from the LOCOS process used to form the gate field plate 70. For example, forming the STI structures 80 may be performed before forming the gate field plate 70.

Referring to FIG. 4, several STI structures 80 are spaced apart from each other at substantially the same positions along the width direction (e.g., of the LDMOS transistor[s] 1). In detail, the STI structures 80 are between the gate electrode(s) 60 and the drain region 530, in the drift region 510. The STI structures 80 may extend a predetermined depth from the surface of the drift region 510, such that the lowermost surface of each STI structure 80 is deeper than the lowermost surfaces of the gate field plates 70. Since the STI structures 80 are adjacent to the gate field plates 70 in the drift region 510, the multi-finger LDMOS transistor device 1 may omit an edge termination region E and the isolation region I.

That is, an isolation configuration is between edge termination regions E between adjacent devices in the related art, but in the LDMOS transistor 1 according to embodiments of the present invention, the edge termination region E is omitted (e.g., not formed), and the STI structures 80 are adjacent to the gate field plate 70 in the drift region 510. It may be considered that one or more isolation regions I (FIG. 3), each containing two or more STI structures 80 (not shown in FIG. 3), are in the core region(s) C. In detail, core regions C between device tips or ends that are adjacent to each other along the width direction may be connected with each other, or proximate or adjacent to each other, and the isolation region I may be in the drift region 510 (FIG. 4) at the interface between adjacent device tips or ends.

FIGS. 6 to 11 are cross-sectional views of structures formed in an exemplary method of fabricating an LDMOS transistor according to embodiments of the present invention.

Hereafter, a method of fabricating an LDMOS transistor according to embodiments of the present invention is described in detail with reference to the accompanying drawings. It should be noted that the steps may be performed in an order different from the order(s) described herein.

Figure 6:
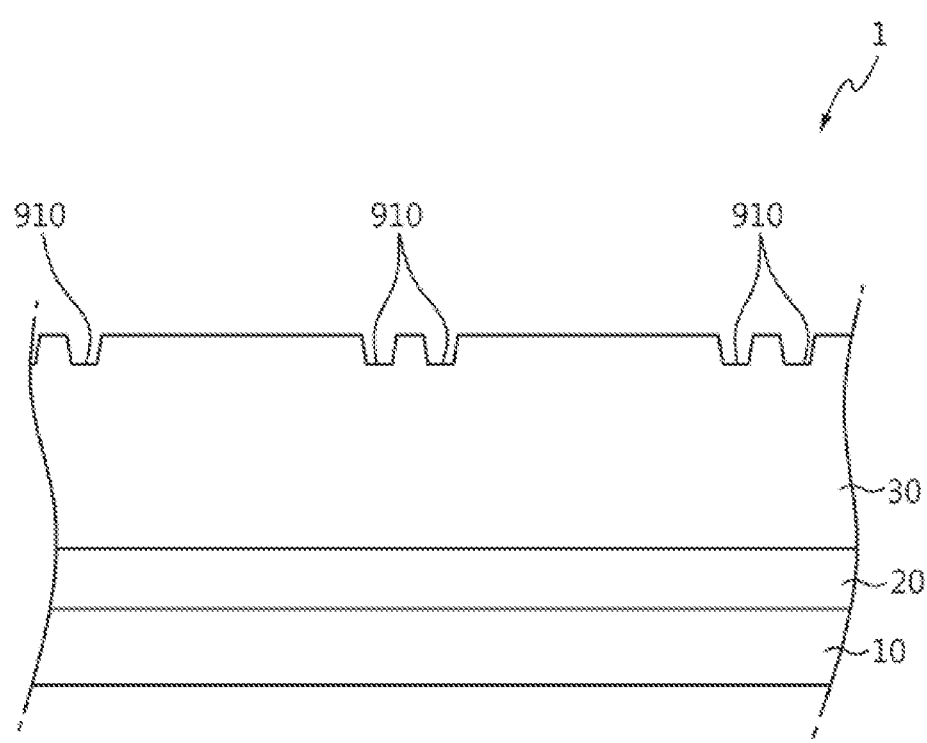
FIGS. 6 to 11 are reference views showing structures made in an exemplary method of fabricating an LDMOS transistor according to one or more embodiments of the present invention.

Referring to FIG. 6, first, a second conductivity type buried layer 20 is formed in a first conductivity type semiconductor substrate 10. For example, the buried layer 20 may be formed by injecting second conductivity type impurity ions into a P-type, single crystal semiconductor substrate (e.g., wafer). Thereafter, a first conductivity type semiconductor layer 30 is formed on the surface of the substrate 10 having the buried layer 20. The semiconductor layer 30, as described above, may be part of the P-type substrate, a P-type diffusion region in such a substrate, or a P-type epitaxial layer that is epitaxially grown on the substrate 10, either before or after forming the buried layer 20. An oxidation layer (e.g., a silicon dioxide layer) and/or a nitrification layer (e.g., a silicon nitride layer) may be stacked (e.g., formed in sequence) on the semiconductor layer 30.

A photoresist pattern is formed on the surface of the semiconductor layer 30 by applying and patterning a photoresist, and then first trenches 910 are formed in the semiconductor layer 30 by etching, using the photoresist pattern as an etching mask.

Figure 7:
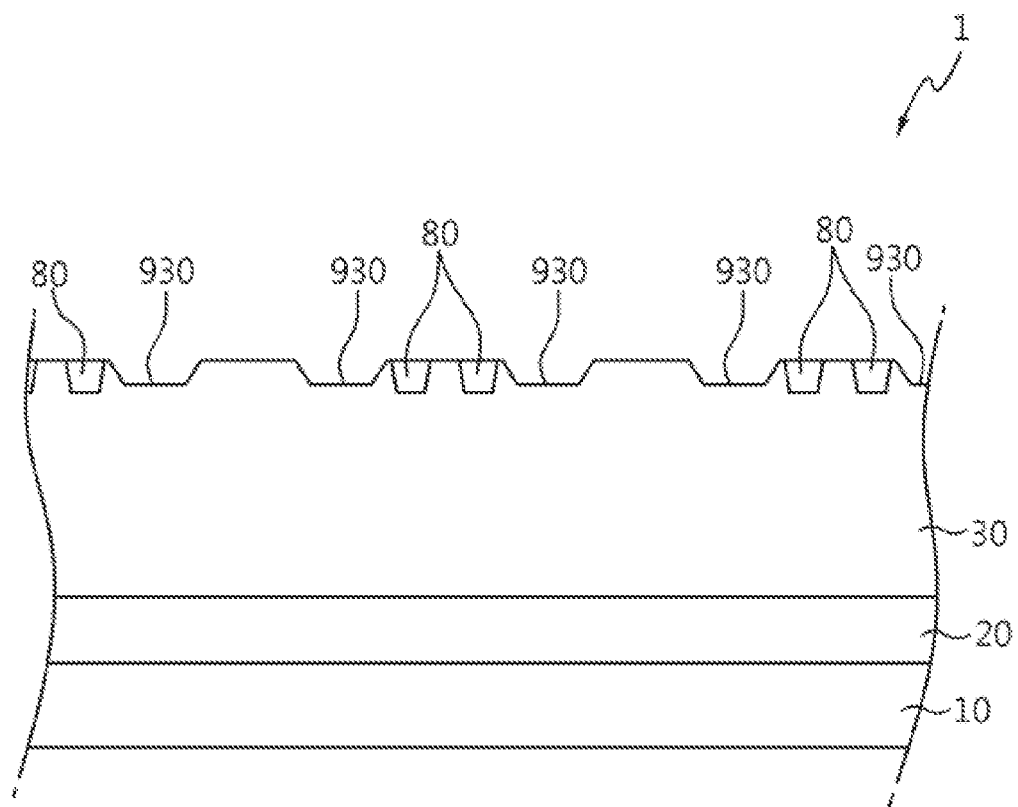
Figure 8:
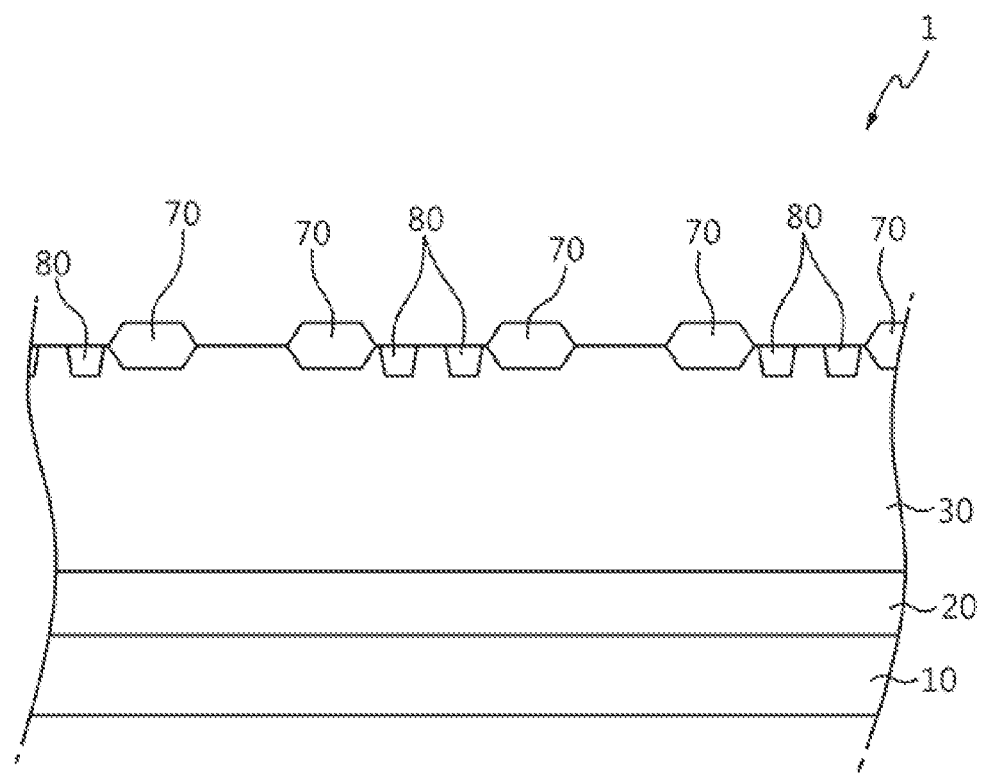

Referring to FIG. 7, STI structures 80 are formed in the trenches 910 of FIG. 6, for example, by an STI process, followed by chemical-mechanical polishing (CMP). Active regions can be defined and adjacent LDMOS transistor devices can be electrically separated by the STI structures 80. As described above, the pairs of STI structures 80 are spaced apart from each other in the longitudinal direction (e.g., along the x-axis in FIG. 7) at substantially the same positions, or by substantially equal distances. The STI structures 80 may be in a drain region 530 that is formed later.

Then, a photoresist pattern is formed on the surface of the semiconductor layer 30 by applying and patterning a photoresist, and then second (e.g., sloped sidewall) trenches 930 are formed by etching using the photoresist pattern as an etching mask. Thereafter, referring to FIG. 8, a gate field plate 70 is formed in the trenches 930 (FIG. 7) using a LOCOS process. The process of forming a gate field plate or field oxide 70 in a trench using a LOCOS process is also known as a recessed LOCOS process.

Figure 9:
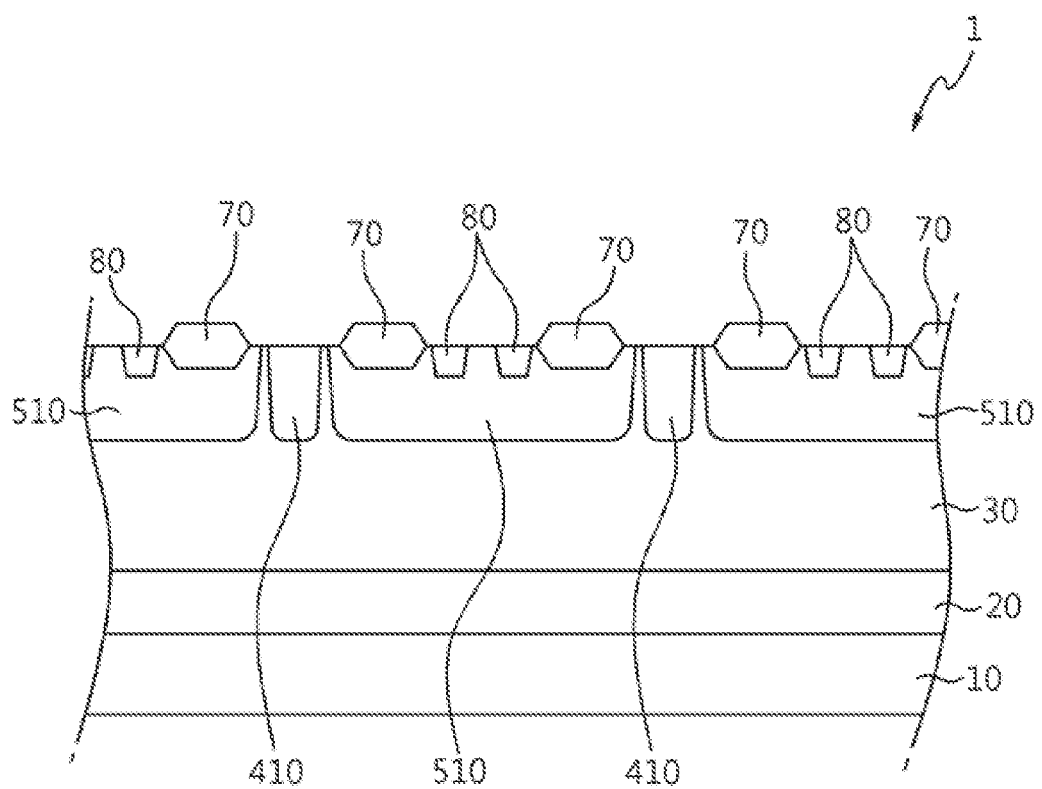

Thereafter, referring to FIG. 9, first conductivity type body regions 410 are formed in the first conductivity type semiconductor layer 30, for example by injecting first conductivity type impurity ions into the semiconductor layer 30. In detail, a photoresist pattern exposing the portion of the semiconductor layer 30 corresponding to the body region 410 is formed, and then first conductivity type impurity ions are injected into the exposed portion (and optionally annealed), thereby forming the body region 410. The photoresist pattern is removed, for example, by an ashing or stripping process.

A second conductivity type drift region 510 is formed in another region of the semiconductor layer 30, for example by an ion injection process. Similar to the body region 410, a photoresist pattern exposing a portion of the semiconductor layer 30 corresponding to the drift region 510 is formed, and then impurity ions are injected into the region (and optionally annealed), thereby forming the drift region 510. The photoresist pattern is removed, for example, by an ashing or stripping process.

Figure 10:
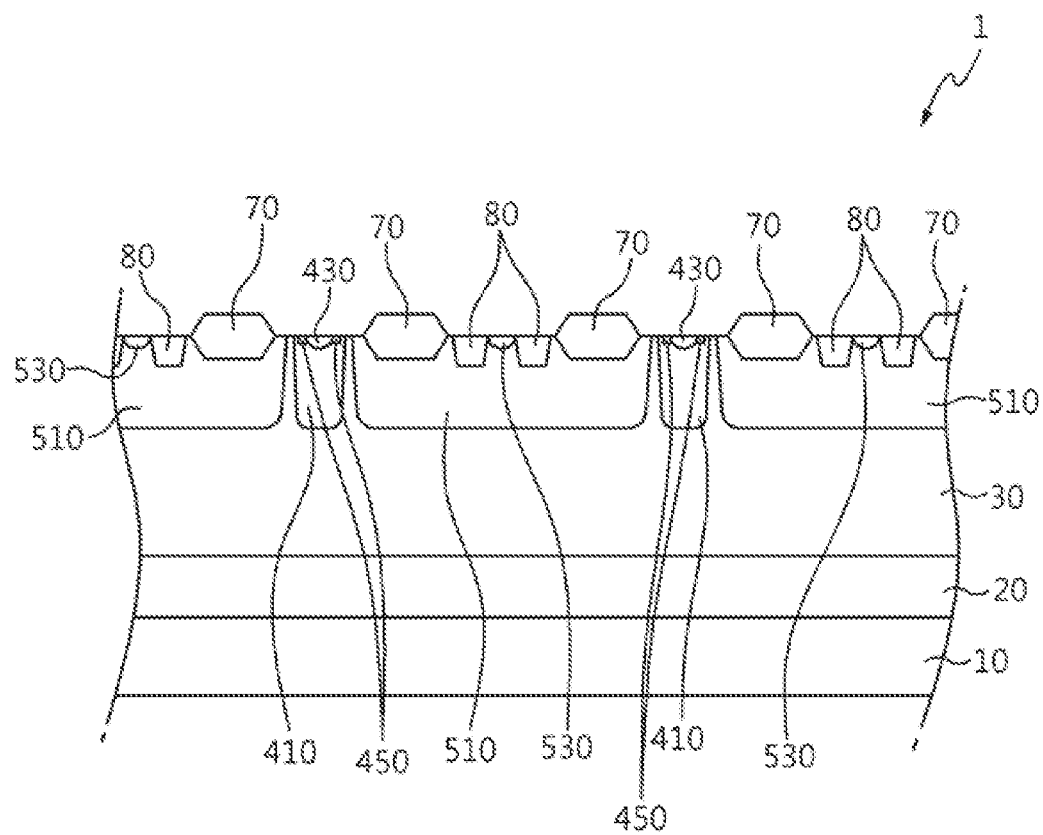

Referring to FIG. 10, for example, a source region 430 is formed in the body region 410 and a drain region 530 is formed in the drift region 510, for example, by injecting second conductivity type impurity ions through a photoresist pattern exposing the regions of the body region 410 and the drift region 510 corresponding respectively to the source region 430 and the drain region 530, used as a mask, then optionally annealing the entire structure, then removing the photoresist pattern by an ashing or stripping process.

Figure 11:
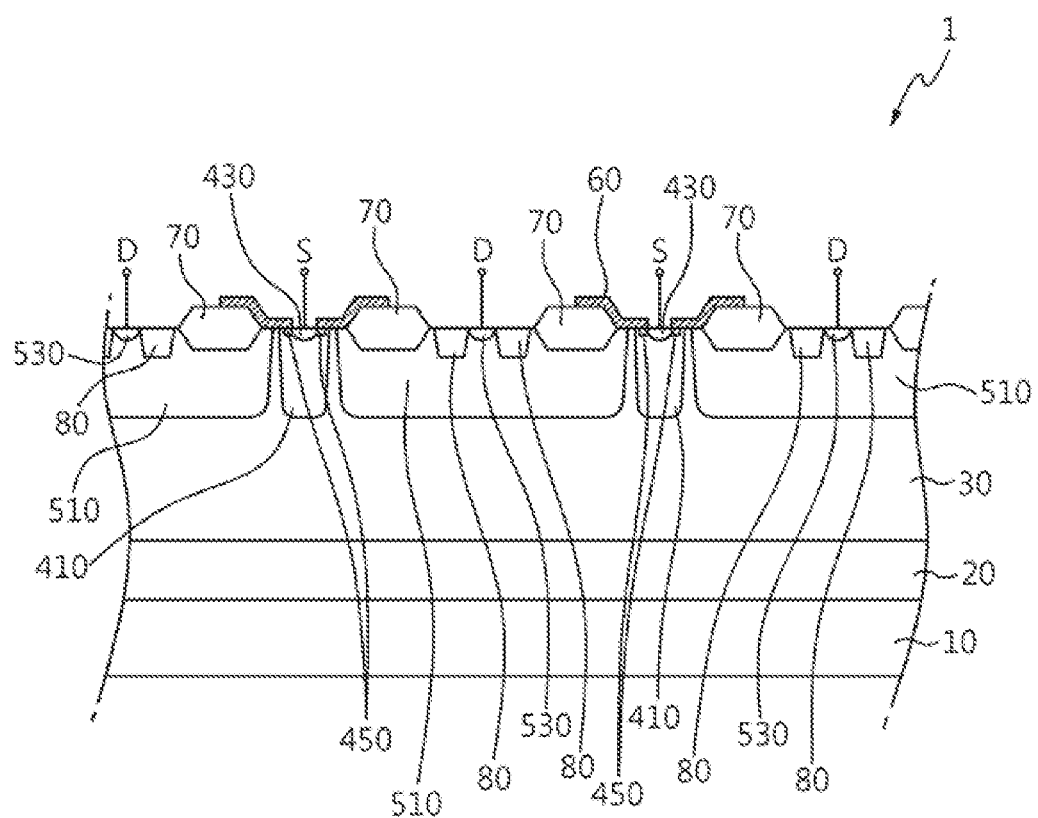

Next, referring to FIG. 11, a polysilicon layer is formed on an uppermost surface of the LDMOS transistor 1, and a gate insulation layer (not shown), gate electrodes 60, and an insulation layer (not shown) are formed (e.g., sequentially). The gate insulation layer and the gate electrodes 60 may partially overlap the gate field plate 70.

Next, a source electrode S and a drain electrode D are formed on the source region 430 and the drain region 530, respectively, by a metal silicide-forming process (e.g., silicidation).

According to the method of fabricating an LDMOS transistor using the processes described above in accordance with various embodiments of the present invention, an edge termination region E that is between adjacent fingers along the width direction of adjacent LDMOS transistors is omitted (e.g., not formed). Further, the STI structures 80 and the gate field plates 70 are in the drift region 510 without separately forming an additional isolation layer between fingers, tips or ends of adjacent LDMOS transistors, thereby reducing the size and/or increasing the electrical characteristics of the power block.

The specification provides examples of the present invention. Further, the description provides various embodiments of the present invention, and the present invention may be used in other various combination, changes, and environments. That is, the present invention may be changed or modified within the scope of the description herein, a range equivalent to the description, and/or within the knowledge or technology in the related art. The embodiments show various states for achieving the spirit of the present invention and may be changed in various ways for detailed applications or different fields and uses. Therefore, the detailed description of the present invention is not intended to limit the present invention to the disclosed embodiments.

What is claimed is:

1. A multi-finger lateral double diffused metal oxide semiconductor (LDMOS) transistor comprising:
   a core region providing a current path through a channel between a second conductivity type source and a second conductivity type drain when a voltage is applied, and connected to another core region along a width direction;
   a device isolation region including one or more shallow trench isolation (STI) structures in the core region;
   a substrate;
   a second conductivity type buried layer on or in the substrate;
   a first conductivity type semiconductor layer on the buried layer;
   a first conductivity type body region on or in the semiconductor layer;
   a second conductivity type drift region on or in the semiconductor layer;
   the second conductivity type source region in the body region;
   the second conductivity type drain region in the drift region;
   a gate electrode on or over the semiconductor layer; and
   a gate field plate under at least part of the gate electrode,
   wherein the STI structure(s) extends from a surface of the drift region and is in a space where core regions are connected along the width direction.

2. The LDMOS transistor of claim 1, wherein an edge termination region between adjacent devices along the width direction is omitted.

3. The LDMOS transistor of claim 1,
   wherein the gate field plate at least partially overlaps the gate electrode and is between the gate electrode and the drain region.

4. The LDMOS transistor of claim 3, wherein the gate field plate comprises a field oxide.

5. The LDMOS transistor of claim 3, wherein the STI structure has a lowermost surface deeper than a lowermost surface of the gate field plate.

6. The LDMOS transistor of claim 3, wherein the STI structure is in a space between the gate field plate and the drain region.

7. A multi-finger lateral double diffused metal oxide semiconductor (LDMOS) transistor comprising:
- a core region having opposed ends and connected to another core region along a width direction;
- a substrate;
- a second conductivity type buried layer on or in the substrate;
- a first conductivity type semiconductor layer on the buried layer;
- a first conductivity type body region on or in the semiconductor layer;
- a second conductivity type drift region on or in the semiconductor layer;
- a gate electrode on or over the semiconductor layer;
- a gate field plate at least partially under the gate electrode;
- a second conductivity type drain region in the drift region; and
- shallow trench isolation (STI) regions adjacent to the gate field plate, the STI regions being in the drift region,
- wherein the STI regions are in a space where core regions are connected along the width direction and spaced apart from each other along a longitudinal direction of the LDMOS transistor.

8. The LDMOS transistor of claim 7, further comprising a second conductivity type source region in the body region, wherein the STI regions are between the source region and the drain region.

9. The LDMOS transistor of claim 7, wherein the LDMOS transistor omits an edge termination region at one end of the core region.

10. The LDMOS transistor of claim 7, wherein the STI regions are between (i) the gate field plate and (ii) the drain region, and lowermost surfaces of the STI regions are deeper than a lowermost surface of the gate field plate.

11. The LDMOS transistor of claim 8, further comprising a first conductivity type contact region adjacent to the source region in the body region.

* * * * *